(12) United States Patent
Hara

(10) Patent No.: US 7,496,810 B2
(45) Date of Patent: Feb. 24, 2009

(54) SEMICONDUCTOR MEMORY DEVICE AND ITS DATA WRITING METHOD

(75) Inventor: Takahito Hara, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 566 days.

(21) Appl. No.: 10/247,356

(22) Filed: Sep. 20, 2002

(65) Prior Publication Data

US 2003/0081480 A1 May 1, 2003

(30) Foreign Application Priority Data

Oct. 24, 2001 (JP) ............................. 2001-326635

(51) Int. Cl.
*G11C 29/00* (2006.01)
(52) U.S. Cl. ...................... 714/721; 714/718
(58) Field of Classification Search ................ 714/718, 714/721; 365/200–201
See application file for complete search history.

(56) References Cited

U.S. PATENT DOCUMENTS

| | | | | |
|---|---|---|---|---|
| 5,200,959 A | * | 4/1993 | Gross et al. | 714/723 |
| 5,237,535 A | * | 8/1993 | Mielke et al. | 365/185.3 |
| 5,732,033 A | * | 3/1998 | Mullarkey et al. | 365/201 |
| 5,923,589 A | | 7/1999 | Kaida et al. | |
| 6,292,914 B1 | * | 9/2001 | Watanabe | 714/721 |

FOREIGN PATENT DOCUMENTS

| | | |
|---|---|---|
| JP | 06-005087 | 1/1994 |
| JP | 07-192479 | 7/1995 |
| JP | 09-139099 | 5/1997 |
| JP | 10-134579 | 5/1998 |
| JP | 2001-273792 | 10/2001 |

OTHER PUBLICATIONS

Tyson, Jeff. "How Flash Memory Works." HowStuffWorks. http://computer.howstuffworks.com/flash-memory1.htm.*

* cited by examiner

*Primary Examiner*—John P Trimmings
*Assistant Examiner*—Steve Nguyen
(74) *Attorney, Agent, or Firm*—Volentine & Whitt, P.L.L.C.

(57) ABSTRACT

This invention provides a semiconductor memory device and its data writing method capable of saving the needed time to a minimum even in repeating a data write operation maximum number of times. More specifically, this invention provides a semiconductor memory device and its data writing method as follows. A flash memory 101 is set at a test mode by fixing the test pad TP at L level. When a verify operation passes, a verify pass signal input terminal (VPASS) of a data write controlling circuit WCC and a verify pass signal input terminal (VPASS) of a data write counter circuit WCT are fixed at L level by a verify pass signal invalidating means 3 although a verify circuit VC outputs an L level verify pass signal VPASS. A latch circuit LC holds a latched verify pass signal VPL at H level and a verify start signal input terminal (VR) of the verify circuit VC is fixed at L level. A write operation without a verify operation is repeated number of times preset in the data write counter circuit WCT.

8 Claims, 12 Drawing Sheets

SEMICONDUCTOR MEMORY DEVICE AND ITS DATA WRITING METHOD

BACKGROUND OF THE INVENTION

1. Field of the Invention

The present invention relates to a semiconductor memory device and its data writing method.

2. Related Art

When a specific data is programmed to (written in) a non-volatile semiconductor memory device such as a flash memory and an EEPROM each with a verify function, a data write operation and a data verify operation are repeated a plurality of times. A verify circuit provided in the non-volatile semiconductor memory device checks threshold voltages Vt in a plurality of memory cells and outputs a verify pass signal when each voltage reaches a desired value. When receiving the verify pass signal from the verify circuit, a data write controlling circuit stops the write operation since then. At this time, the data programming to the non-volatile semiconductor memory device ends.

Normally in a non-volatile semiconductor memory device, the data programming ends when the data write/verify operation is repeated approximately three times. In other words, the repetition of data write/verify operation ends before reaching the maximum number of times of data writing (eight times, for example). Conventionally, for this reason, it has been difficult to grasp the period of time needed for testing a non-volatile semiconductor memory device product in repeating the data write operation maximum number of times. Also, it has been actually impossible to estimate the difference of the memory cell characteristics among chips or wafers since each number of times of data write operation until the verify operation passes is different in each memory cell.

In order to solve this problem, there has been already presented a non-volatile semiconductor memory device (JP 11-086575, A) wherein, in the test mode, the data write/verify operation is repeated until reaching maximum number of times of data writing preset in a data write counter circuit. According to this non-volatile semiconductor memory device, when the verify operation passes before reaching maximum number of times of data writing, the data write operation continues to be repeated regardless of this result.

According to the conventional non-volatile semiconductor memory device, however, the data write operation continues to be repeated with the verify operation continued to be repeated even after the verify operation has passed. This state is not preferable in view of saving the time for testing a non-volatile semiconductor memory device product.

The present invention has been achieved in view of aforementioned problems. The object of the present invention is to provide novel and improved semiconductor memory device and its data writing method capable of saving the time for testing to a minimum even in repeating the data write operation maximum number of times.

SUMMARY OF THE INVENTION

In the first aspect of the present invention to achieve the above object, there is provided a semiconductor memory device comprising: a memory cell for storing data; a verify circuit for verifying data stored in the memory cell when a verify start signal is input and for outputting a verify pass signal when a desired result is obtained; a data write controlling circuit for repeating a data write operation to the memory cell specific number of times until the verify pass signal is input and for outputting the verify start signal after each data write operation; a verify pass signal invalidating means for invalidating the verify pass signal when a test mode is set; and a verify operation omitting means for enabling invalidating the verify start signal when the test mode is set.

In the test mode, even if the verify circuit outputs the verify pass signal until the number of times of data write operation's repeating reaches a specific number, the verify pass signal invalidating means invalidates the verify pass signal. Therefore, the data write operation can be repeated specific number of times. Further the verify operation omitting means becomes active when receiving a verify pass signal outputted first from the verify circuit after the test mode is set, and since then the activated verify operation omitting means invalidates the verify start signal outputted from the data write controlling circuit. Consequently, the data verify operation can be omitted in repeating the data write operation specific number of times.

Also, the semiconductor memory device can be configured as the verify operation omitting means becoming active when the test mode is set. In this configuration, a data write operation without the data verify operation starts as soon as the test mode is set, and this data write operation is repeated specific number of times.

Preferably, the activated verify operation omitting means stops an output of the verify start signal to the data write controlling circuit when receiving the verify start signal from the data write controlling circuit. Hereby the data write operation is repeated in short cycles.

Preferably, a data write operation to a memory cell after the verify operation omitting means becomes active is executed by applying a voltage only to a gate among source, drain and gate, of a transistor configuring the memory cell. Hereby the threshold voltage of the memory cell can be adjusted at a specific level.

In the second aspect of the present invention, there is provided a data writing method of a semiconductor memory device comprising a normal mode and a test mode wherein: in the normal mode, a data write operation and a data verify operation are repetitively executed in order until the data write operation and the data verify operation are repeated specific number of times or until a threshold voltage of a memory cell reaches a specific value; and in the test mode, a data write operation and a data verify operation are repetitively executed in order until a threshold voltage of a memory cell reaches a specific value and only a data write operation is repetitively executed until the data write operation is repeated specific number of times after a threshold voltage of the memory cell reaches a specific value.

According to this method, in the test mode, the data write operation without the data verify operation is repetitively executed after a threshold voltage of the memory cell reaches a specific value. Hereby the product test can be finished in a short time even in repeating the data write operation maximum number of times in the test mode.

Also preferably in the test mode, the data write operation without the data verify operation is repeated specific number of times from the beginning in order to save the time for testing whether the threshold voltage of the memory cell reaches a specific value or not.

Preferably, a data write operation repeated specific number of times in the test mode is executed by applying a voltage only to a gate among source, drain and gate, of a transistor configuring the memory cell. Hereby the threshold voltage of the memory cell can be adjusted at a specific level.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
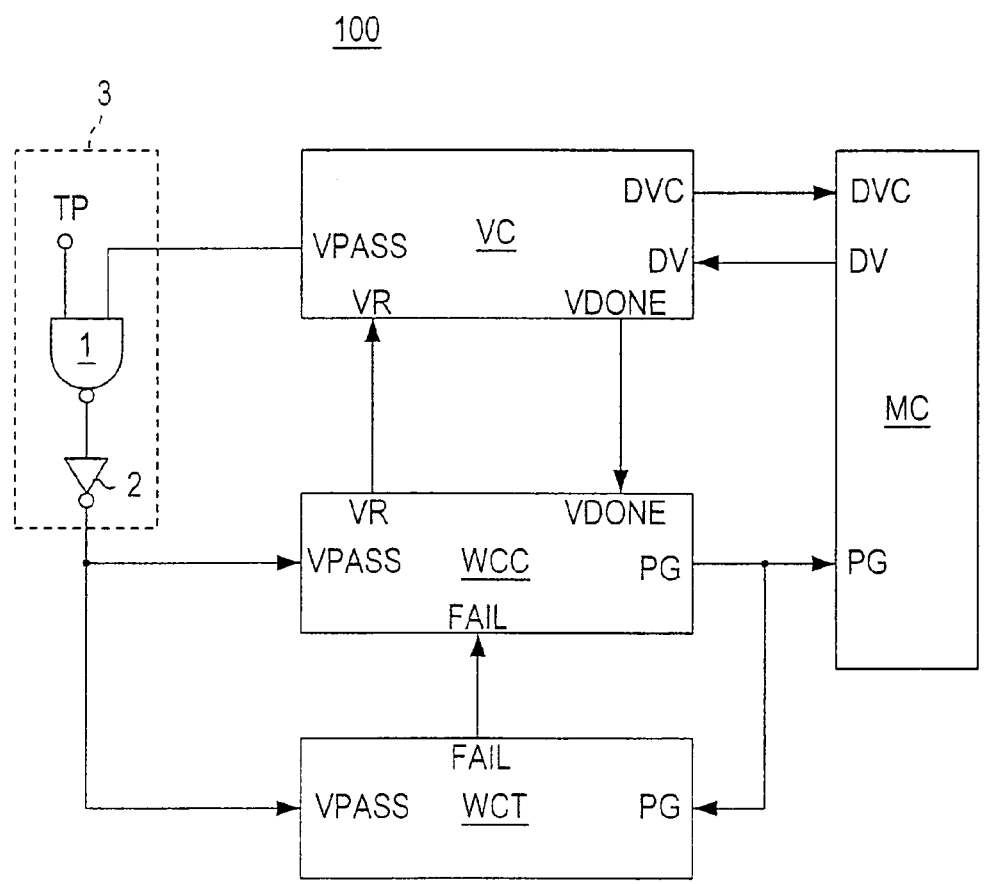
FIG. 1 is a circuit diagram showing the configuration of a flash memory capable of repeating a data write operation specific number of times in a test mode.

Hereinafter, the preferred embodiment of the present invention will be described in reference to the accompanying drawings. Same reference numerals are attached to components having same functions in following description and the accompanying drawings, and a description thereof is omitted.

First, there will be explained the configuration of a flash memory 100 and the operation thereof as a semiconductor memory device wherein, in the test mode, the data write/verify operation is repeated until reaching maximum number of times of data writing preset in a data write counter circuit.

The flash memory 100 is configured by a memory cell MC, a data write controlling circuit WCC, a data write counter circuit WCT, a verify circuit VC and a verify pass signal invalidating means 3, as shown in FIG. 1.

The data write controlling circuit WCC outputs a programming signal PG to the memory cell MC and the data write counter circuit WCT in a data write operation (hereafter, referred to as write operation) and outputs a verify start signal VR to the verify circuit VC after the write operation has finished.

The verify circuit VC outputs a data voltage level checking signal DVC to the memory cell MC and receives a data voltage level signal DV from the memory cell MC in a data verify operation (hereafter, referred to as verify operation), and outputs a verify done signal VDONE to the data write controlling circuit WCC after the verify operation has finished. Further, the verify circuit VC transmits a verify pass signal VPASS indicating whether the verify operation has passed or not to the verify pass signal invalidating means 3.

When a test pad TP is set at a logical high level (hereafter, referred to as H level), the verify pass signal invalidating means 3 transmits the verify pass signal VPASS transmitted from the verify circuit VC to the verify pass signal input terminal (VPASS) of the data write controlling circuit WCC and the verify pass signal input terminal (VPASS) of the data write counter circuit WCT, without changing the logical level. On the other hand, when a test pad TP is set at a logical low level (hereafter, referred to as L level), the verify pass signal invalidating means 3 inverts the verify pass signal VPASS to an L level signal and transmits this signal to the verify pass signal input terminal (VPASS) of the data write controlling circuit WCC and the verify pass signal input terminal (VPASS) of the data write counter circuit WCT.

The data write counter circuit WCT outputs a write operation fail signal FAIL indicating the final fail of data writing to the data write controlling circuit WCC, when the verify operation does not pass even if the write operation is repeated maximum number of times preset in the data write counter circuit WCT.

Figure 2:
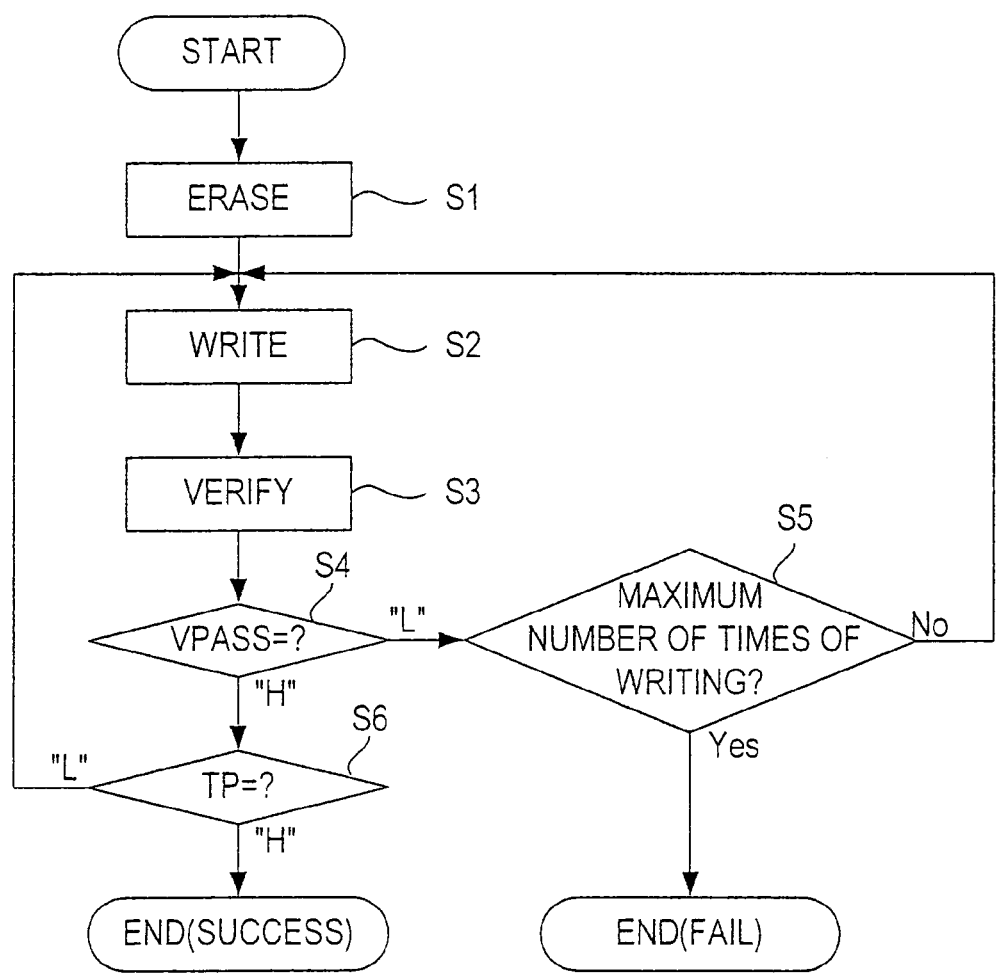
FIG. 2 is a flow chart showing the operation of the flash memory shown as FIG. 1.

The data program operation of the flash memory 100 as configured above will be explained in reference to the flow chart of FIG. 2 and the timing chart of FIG. 3.

First, there will be explained the data program operation of the flash memory 100 in which a normal mode is set by fixing the test pad TP at H level.

In starting the data program operation, the flash memory 100 executes a data erase operation first (step S1) and the write operation next (step S2).

When the write operation has finished, the data write controlling circuit WCC outputs the verify start signal VR to the verify circuit VC. The verify circuit VC receiving the verify start signal VR starts the verify operation (step S3).

When the verify operation has finished, the verify circuit VC outputs a one-shot verify done signal VDONE to the data write controlling circuit WCC and outputs the verify pass signal VPASS to the verify pass signal invalidating means 3 at the same time. The verify pass signal VPASS is input to one of the input terminals of an NAND gate 1 in the verify pass signal invalidating means 3. The data write controlling circuit WCC receiving the verify done signal VDONE from the verify circuit VC stops the output of the verify start signal VR.

The verify circuit VC checks the data voltage level signal DV output from the memory cell MC as the verify operation, then outputs an L level verify pass signal VPASS when judging that the threshold voltage Vt of the memory cell MC does not reach a specific level through the write operation, and, on the other hand, outputs an H level verify pass signal VPASS when judging that the threshold voltage Vt of the memory cell MC reaches a specific level (step S4).

When the verify circuit VC outputs the L level verify pass signal VPASS, the verify pass signal invalidating means 3 in which the test pad TP is adjusted at H level transmits an L level signal to the verify pass signal input terminal (VPASS) of the data write controlling circuit WCC and the verify pass signal input terminal (VPASS) of the data write counter circuit WCT.

When the write operation is not repeated maximum number of times (eight times, for example) preset in the data write counter circuit WCT, the data write counter circuit WCT does not output the write operation fail signal FAIL, which is not input to the data write controlling circuit WCC. As described above, when receiving the verify done signal VDONE from the verify circuit VC, the data write controlling circuit WCC stops the output of the verify start signal VR (the verify start signal VR is turned to L level). At the same time, the data write controlling circuit WCC verifies that the write operation fail signal FAIL is not input and that the verify pass signal input terminal (VPASS) is L level, and then outputs the programming signal PG to the memory cell MC and the data write counter circuit WCT to re-execute the write operation. On the other hand, when the write operation is repeated maximum number of times preset in the data write counter circuit WCT, the data write counter circuit WCT outputs the write operation fail signal FAIL to the data write controlling circuit WCC (step S5). Finally, the data program operation ends with "fail".

When the verify circuit VC outputs the H level verify pass signal VPASS, the verify pass signal invalidating means 3 in which the test pad TP is adjusted at H level transmits an H level signal to the verify pass signal input terminal (VPASS) of the data write controlling circuit WCC and the verify pass signal input terminal (VPASS) of the data write counter circuit WCT (step S6). And then, the data program operation ends with "success".

As described above, when the flash memory 100 is set at the normal mode, in other words, when the test pad TP is fixed at H level, the verify pass signal invalidating means 3 transmits a signal conforming to the logical level of the verify pass signal VPASS output from the verify circuit VC, to the verify pass signal input terminal (VPASS) of the data write controlling circuit WCC and the verify pass signal input terminal (VPASS) of the data write counter circuit WCT. Then the flash memory 100 repeats the write operation until the verify operation passes to turn the verify pass signal VPASS to H level or until the write operation is repeated maximum number of times preset in the data write counter circuit WCT.

Next, there will be explained the data program operation of the flash memory 100 in which a test mode is set by fixing the test pad TP at L level.

In steps S1~S5, the flash memory 100 in the test mode operates similarly to that in the normal mode described above. The difference from that in the normal mode is the operation after the verify circuit VC outputs the H level verify pass signal VPASS.

In the normal mode, since the test pad TP is adjusted at H level, the verify pass signal invalidating means 3 transmits an H level signal to the verify pass signal input terminal (VPASS) of the data write controlling circuit WCC and the verify pass signal input terminal (VPASS) of the data write counter circuit WCT, according to the H level verify pass signal VPASS input. At this time, the data program operation ends with "success" even if the write operation is not repeated maximum number of times.

However, when the flash memory 100 is set at the test mode, since the test pad TP is fixed at L level, the verify pass signal invalidating means 3 transmits an L level signal, regardless of the logical level of the input verify pass signal VPASS, to the verify pass signal input terminal (VPASS) of the data write controlling circuit WCC and the verify pass signal input terminal (VPASS) of the data write counter circuit WCT. In other words, even if the verify circuit VC outputs the H level verify pass signal VPASS, the verify pass signal invalidating means 3 transmits an L level signal, instead of the verify pass signal VPASS, to the verify pass signal input terminal (VPASS) of the data write controlling circuit WCC and the verify pass signal input terminal (VPASS) of the data write counter circuit WCT. For this reason, the data write controlling circuit WCC outputs the programming signal PG again to repeat the instruction to start the write operation (step S6).

The data write counter circuit WCT counts the number of write operation, receiving the programming signal PG output from the data write controlling circuit WCC. And then, when the write operation is repeated maximum number of times, the data write counter circuit WCT outputs the write operation fail signal FAIL to the data write controlling circuit WCC. Finally, the data program operation in the test mode ends.

Figure 3:
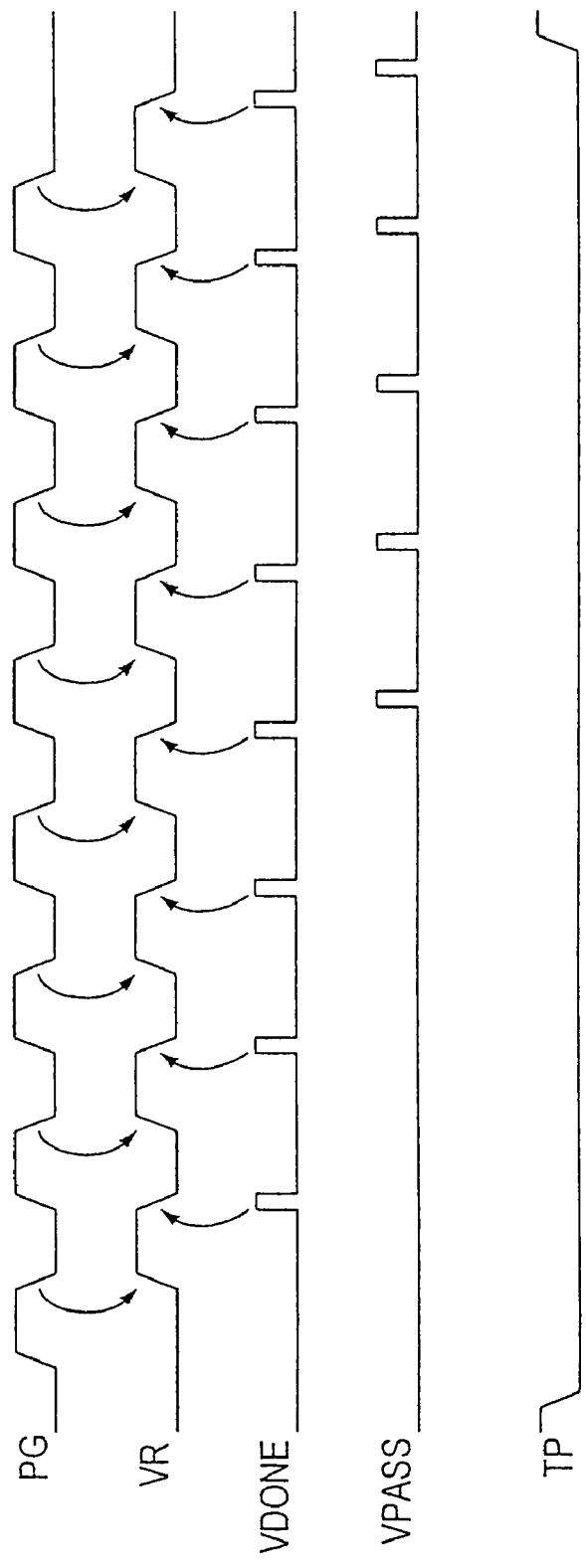
FIG. 3 is a timing chart showing the operation of the flash memory shown as FIG. 1.

The timing chart of FIG. 3 shows the data program operation when the flash memory 100 is set at the test mode. In this figure, the verify operation passes in the fourth verify operation, and the verify pass signal VPASS rises to H level. At this time, however, the data program operation does not end, and after that the write operation and the verify operation are repeated. Then when the write/verify operation is repeated maximum number of times (eight times, for example), the data program operation ends.

According to the flash memory 100 and the data program operation thereof, as described above, it becomes possible to grasp the needed period of time and the depth of writing to the memory cell in repeating the data write operation maximum number of times. As clarified in FIG. 3, however, the verify operation is repeated along with each write operation continuously repeated after the verify operation has passed as well as each write operation repeated before the verify operation passes. In order to save the period of time needed for testing in repeating the write operation maximum number of times, it is desirable to omit the verify operation executed after each write operation properly.

First Embodiment

There will be explained the configuration of a flash memory 101 and the operation thereof as a semiconductor memory device in the first embodiment of the present invention.

Figure 4:
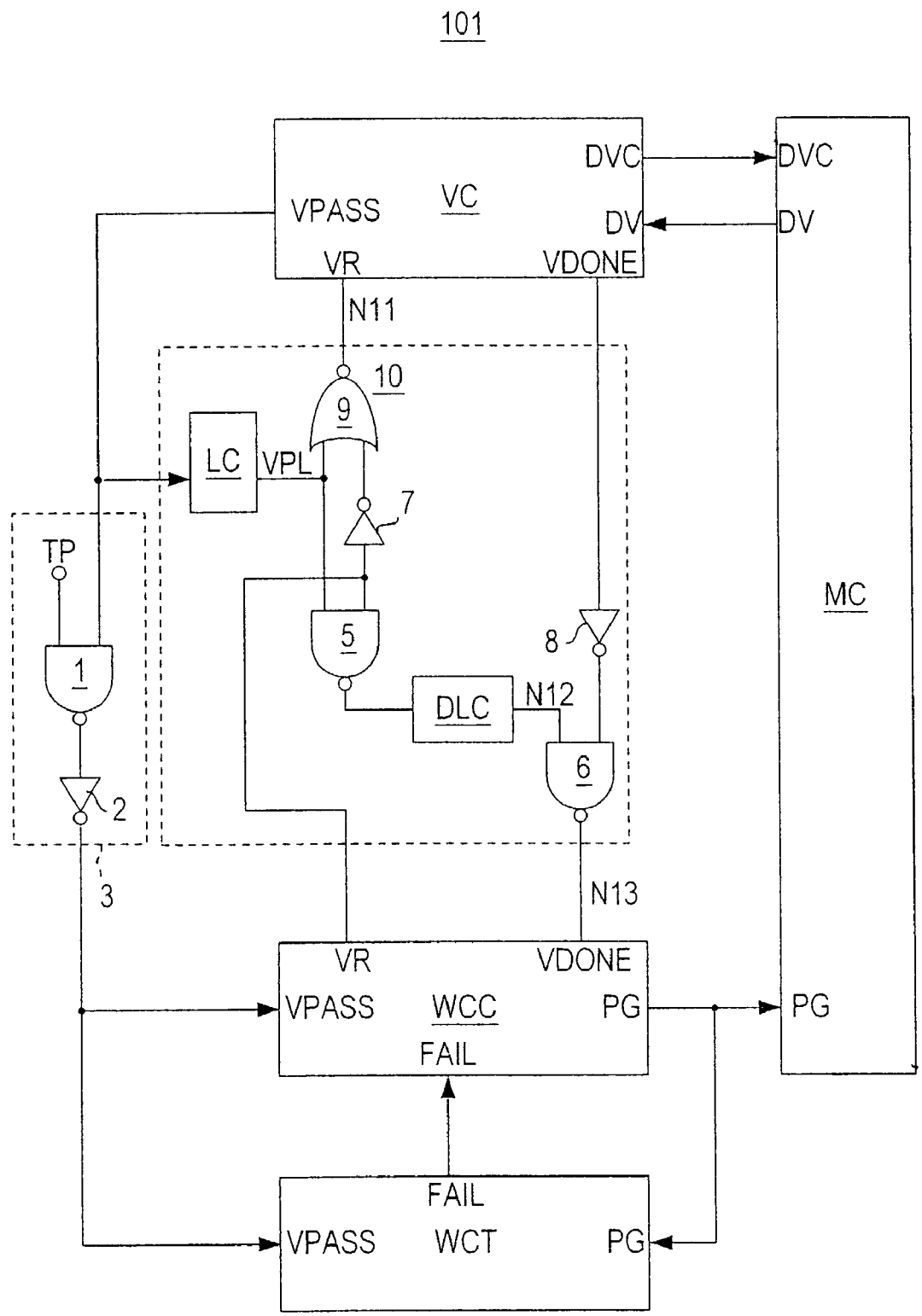
FIG. 4 is a circuit diagram showing the configuration of a flash memory in the first embodiment of the present invention.

The flash memory 101 is configured by a memory cell MC, a data write controlling circuit WCC, a data write counter circuit WCT, a verify circuit VC, a verify pass signal invalidating means 3 and a verify operation omitting means 10 as shown in FIG. 4. The verify operation omitting means 10 is added as the configuration of the flash memory 101, compared with the flash memory 100 described above.

The verify operation omitting means 10 is configured by a latch circuit LC, NAND gates 5 and 6, inverters 7 and 8, an NOR gate 9 and a delay circuit DLC.

The latch circuit LC latches an H level verify pass signal VPASS output from the verify circuit VC and outputs as a latched verify pass signal VPL of H level. It is to be noted that the initial value of the latched verify pass signal VPL is L level.

One of the input terminals of the NAND gate 5 is connected to a verify start signal output terminal (VR) of the data write controlling circuit WCC. Also, the other input terminal of the NAND gate 5 is connected to the latched verify pass signal output terminal (VPL) of the latch circuit LC. The output terminal of the NAND gate 5 is connected to one of the input terminals of the NAND gate 6 via the delay circuit DLC. The delay circuit DLC transmits the signal output from the NAND gate 5, delayed in a specific period of time, to one of the input terminals of the NAND gate 6 via a node N12.

The other input terminal of the NAND gate 6 is connected to the output terminal of the inverter 8 while the output terminal of the NAND gate 6 to the verify done signal input terminal (VDONE) of the data write controlling circuit WCC via a node N13.

The input terminal of the inverter 8 is connected to the verify done signal output terminal (VDONE) of the verify circuit VC.

The input terminal of the inverter 7 is connected to the verify start signal output terminal (VR) of the data write controlling circuit WCC while the output terminal thereof to one of the input terminal of the NOR gate 9.

The other input terminal of the NOR gate 9 is connected to the latched verify pass signal output terminal (VPL) of the latch circuit LC. The output terminal of the NOR gate 9 is connected to the verify start signal input terminal (VR) of the verify circuit VC via a node N11.

One of the input terminals of an NAND gate 1 in the verify pass signal invalidating means 3 is connected to the verify pass signal output terminal (VPASS) of the verify circuit VC while the other input terminal of the NAND gate 1 to a test pad TP. The output terminal of the NAND gate 1 is connected to the verify pass signal input terminal (VPASS) of the data write controlling circuit WCC and the verify pass signal input terminal (VPASS) of the data write counter circuit WCT via an inverter 2.

Figure 5:
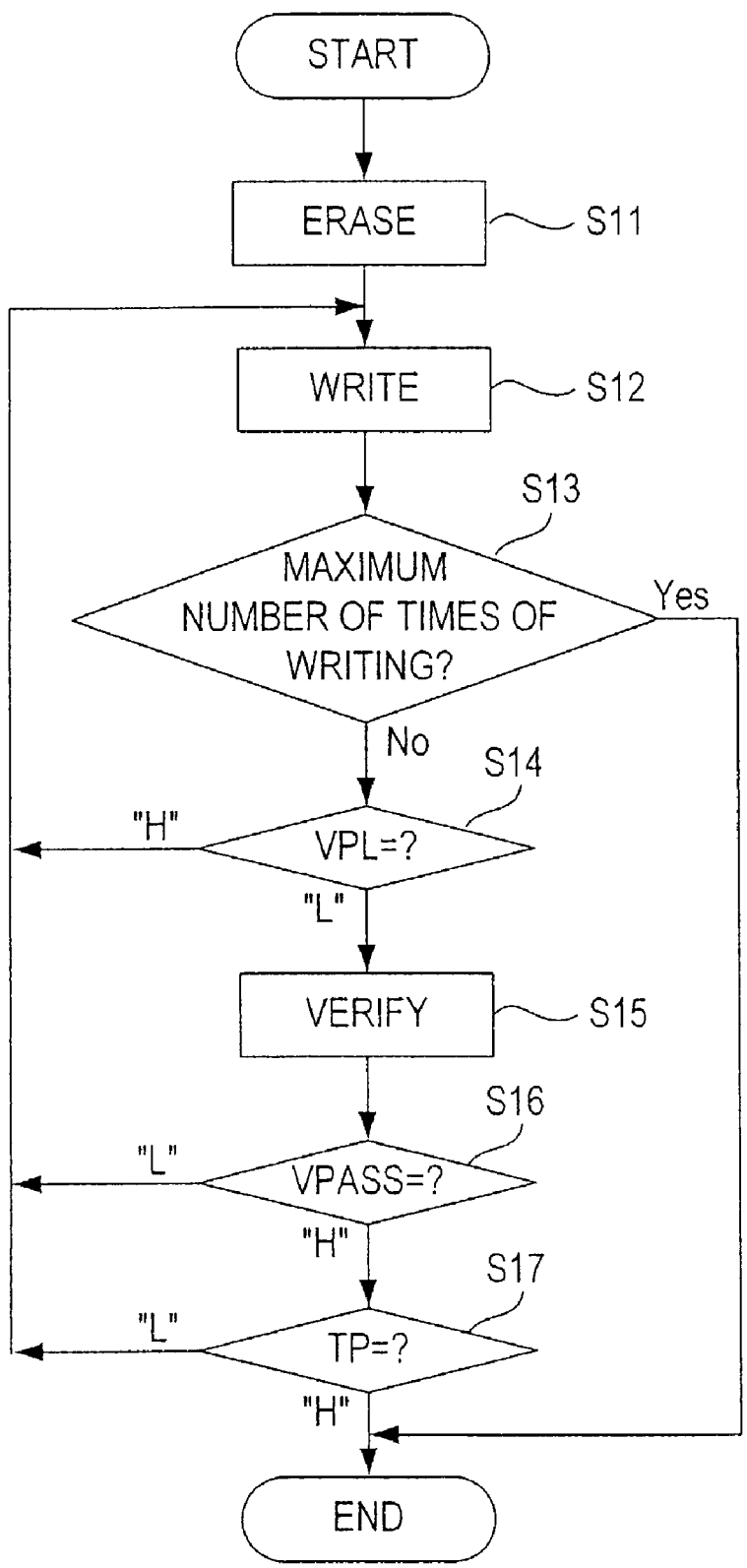
FIG. 5 is a flow chart showing the operation of the flash memory shown as FIG. 4.
Figure 6:
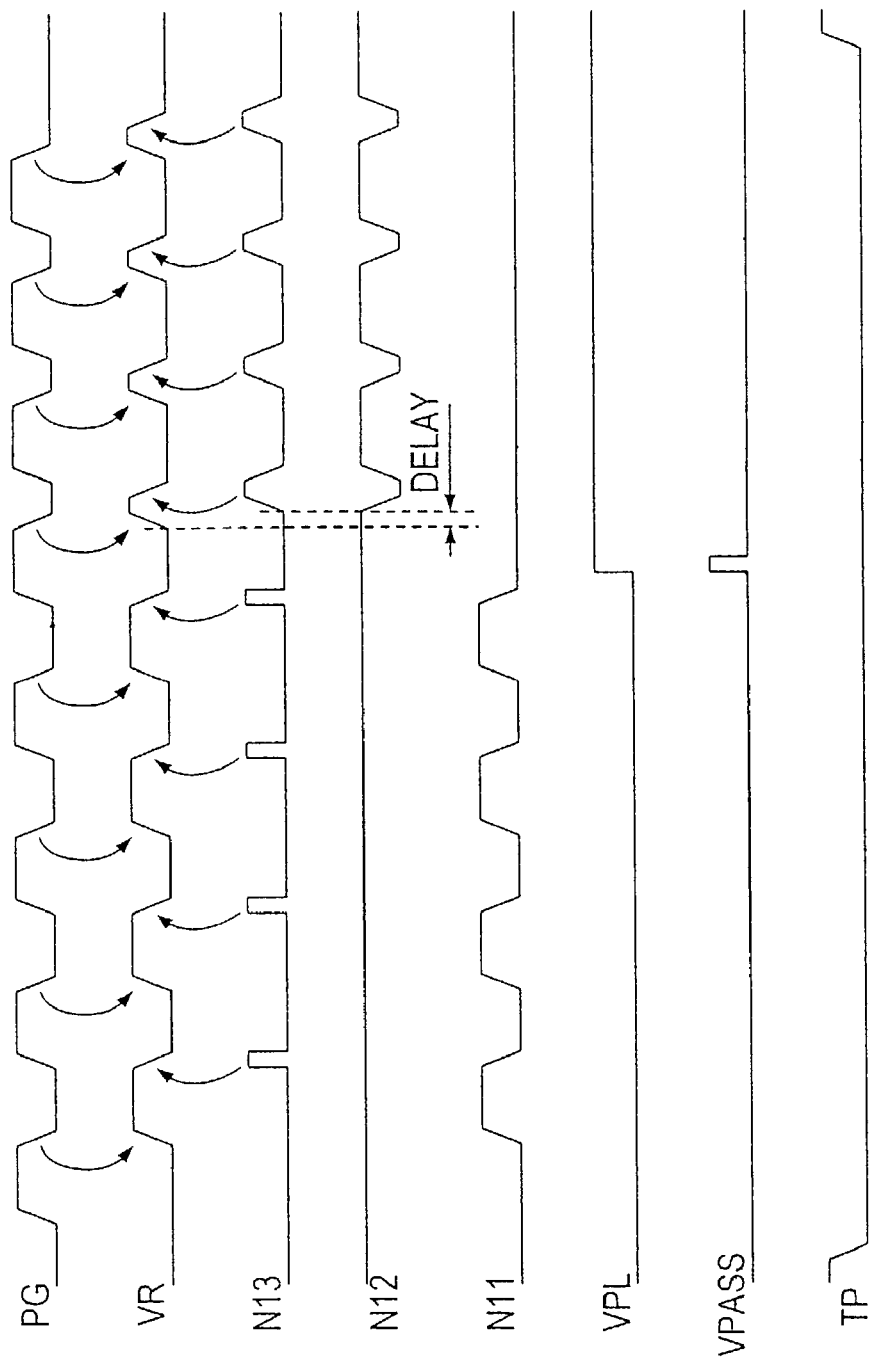
FIG. 6 is a timing chart showing the operation of the flash memory shown as FIG. 4.

The data program operation of the flash memory 101 as configured above will be explained in reference to the flow chart of FIG. 5 and the timing chart of FIG. 6.

First, the data program operation in this embodiment will be explained in reference to the flow chart of FIG. 5.

In starting the data program operation, the flash memory 101 executes a data erase operation first (step S11) and the write operation next (step S12).

After the write operation and before the verify operation, the judgment is made whether the write operation is repeated maximum number of times or not preset in the data write counter circuit WCT (step S13).

When the write operation is repeated maximum number of times, the data program operation ends. On the other hand, when the write operation is not repeated maximum number of times, the judgment is made whether the memory cell MC in which data will be written has already passed or not in the verify operation. More specifically, the logical level of the latched verify pass signal VPL is checked (step S14). By including here the step of checking the logical level of the latched verify pass signal VPL, when the flash memory 101 is set at the test mode, in other words, when the test pad TP is fixed at L level and the verify pass signal invalidating means 3 is enabled, the write operation without the verify operation is repeated once the verify operation has passed in the flash memory 101. This operation will be detailed later.

When the latched verify pass signal VPL is H level, in other words, when the write operation to the memory cell MC has been already executed once or more and the verify operation has passed, the verify operation is not re-executed and the next write operation starts (step S12). Since then, only the write operation is repeated without the verify operation being executed until the number of repeating time reaches the maximum number of writing (loop of steps S12, 13 and 14).

On the other hand, when the latched verify pass signal VPL is L level, in other words, when the verify operation has never passed, the verify operation is executed (step S15) and the logical level of the verify pass signal VPASS is checked (step S16).

When the verify pass signal VPASS is L level, in other words, when the result of the verify operation is "fail", the next write operation starts (step S12). When the verify pass signal VPASS is H level, in other words, when the verify operation has passed, the latched verify pass signal VPL is latched at H level and the logical level of the test pad TP is checked (step S17).

When the test pad TP is fixed at L level, in other words, when the flash memory 101 is set at the test mode, the next write operation starts (step S12). When the test pad TP is fixed at H level, in other words, when the flash memory 101 is set at the normal mode, the data program operation ends.

Next, the operations in the normal and test modes of the flash memory 101 will be explained in reference to the circuit diagram of FIG. 4 and the timing chart of FIG. 6.

(1) Normal Mode

The flash memory 101 is set at a normal mode by fixing the test pad TP at H level.

The data write controlling circuit WCC outputs an H level verify start signal VR after outputting an H level programming signal PG and executing the write operation to the memory cell MC. The H level verify start signal VR is input to one of the input terminals of the NOR gate 9 via the inverter 7 and to one of the input terminals of the NAND gate 5.

Since the latched verify pass signal VPL output from the latch circuit LC is L level (initial value) until the verify operation passes, the other input terminal of the NAND gate 5 and the other input terminal of the NOR gate 9 are maintained inactive states.

Therefore, the NOR gate 9 transmits a signal synchronizing with the verify start signal VR output from the data write controlling circuit WCC and conforming to the logical level thereof to the verify start signal input terminal (VR) of the verify circuit VC via a node N11.

Also, the NAND gate 5 transmits an H level signal to the delay circuit DLC regardless of the verify start signal VR output from the data write controlling circuit WCC. For this reason, one of the input terminals of the NAND gate 6 connected to the node N12 is fixed at H level. Consequently, the NAND gate 6 transmits a signal synchronizing with the verify done signal VDONE output from the verify circuit VC when the verify operation ends and conforming to the logical level thereof to the verify done signal input terminal (VDONE) of the data write controlling circuit WCC via a node N13.

Since the verify pass signal input terminal (VPASS) of the data write controlling circuit WCC and the verify pass signal input terminal (VPASS) of the data write counter circuit WCT maintain L level when the result of verify operation is "fail", the write operation is repeated. On the other hand, since the verify circuit VC outputs the H level verify pass signal VPASS when the verify operation passes, the verify pass signal invalidating means 3 transmits an H level signal to the verify pass signal input terminal (VPASS) of the data write controlling circuit WCC and the verify pass signal input terminal (VPASS) of the data write counter circuit WCT. At this time, the data program operation ends.

As described above, the flash memory 101 in the normal mode repeats the data program operation and ends when the data program operation has passed.

(2) Test Mode

The flash memory 101 is set at a test mode by fixing the test pad TP at L level.

In the test mode, as in the normal mode, since the latched verify pass signal VPL output from the latch circuit LC is L level (initial value) until the verify operation passes, the other input terminal of the NAND gate 5 and the other input terminal of the NOR gate 9 are maintained inactive states. Therefore, a signal synchronizing with the verify start signal VR output from the data write controlling circuit WCC and conforming to the logical level thereof is input to the verify start signal input terminal (VR) of the verify circuit VC. On the other hand, a signal synchronizing with the verify done signal VDONE output from the verify circuit VC and conforming to the logical level thereof is input to the verify done signal input terminal (VDONE) of the data write controlling circuit WCC.

When the result of verify operation is "fail", the flash memory 101 in the test mode operates as in the normal mode, in other words, the verify pass signal input terminal (VPASS) of the data write controlling circuit WCC and the verify pass signal input terminal (VPASS) of the data write counter circuit WCT maintain L level. Consequently, the write operation is repeated.

On the other hand, when the verify operation passes, the flash memory 101 in the test mode operates as follows.

Since the test pad TP is fixed at L level, the verify pass signal input terminal (VPASS) of the data write controlling circuit WCC and the verify pass signal input terminal (VPASS) of the data write counter circuit WCT are fixed at L level by the verify pass signal invalidating means 3 even if the verify circuit VC outputs the H level verify pass signal VPASS. Therefore, the write operation is repeated.

The latch circuit LC receives an H level verify pass signal VPASS and outputs the latched verify pass signal VPL of H level. For this reason, the other input terminal of the NAND gate 5 and the other input terminal of the NOR gate 9 are maintained active states.

In the flash memory 101 in the test mode, as described above, the write operation is repeated until reaching the maximum number of writing even after the verify operation has passed. However, when the H level verify start signal VR from the data write controlling circuit WCC is output after the verify operation has passed, a signal with a specific delay in the verify start signal VR is input to a node N13 and the verify done signal input terminal (VDONE) of the data write controlling circuit WCC through the operations of NAND gate 5, delay circuit DLC and NAND gate 6. Then, as shown in the timing chart of FIG. 6, the data write controlling circuit WCC synchronizes with the rise edge of the signal input to the verify done signal input terminal (VDONE), and transits the verify start signal VR from H level (active) to L level (inactive).

Setting the delay time short by adjusting the time constant of the delay circuit DLC, the data write controlling circuit WCC receives the dummy signal of the verify done signal VDONE at the verify done signal output terminal (VDONE) as soon as outputting the H level verify start signal VR. In addition, the data write controlling circuit WCC has received the L level signal at the verify pass signal input terminal (VPASS) from the verify pass signal invalidating means 3. Therefore, the data write controlling circuit WCC outputs the programming signal PG soon after outputting the H level verify start signal VR for an extremely short time.

Also, once the verify operation has passed, the latch circuit LC holds the latched verify pass signal VPL at H level and the verify start signal input terminal (VR) of the verify circuit VC connected to the node N11 is fixed at L level. If the verify start signal input terminal (VR) is L level, the verify operation is not executed and the verify circuit VC does not output the H level verify pass signal VPASS. Consequently, after the verify operation has passed, only the write operation is repeated and the verify operation is omitted. And then when the write operation has been repeated maximum number of times, the data program operation ends.

According to the flash memory 101 and the data program operation thereof in the first embodiment, as described above, the data write controlling circuit WCC in which the verify operation has passed receives the dummy signal of the verify done signal VDONE at the verify done signal output terminal (VDONE) as soon as outputting the H level verify start signal VR, in the test mode. Also, once the verify operation has passed, the verify circuit VC does not execute the verify operation. After the verify operation has passed, consequently, the write operation without the verify operation is repeated in short cycles. As a result, the period of time needed for testing can be saved.

Second Embodiment

There will be explained the configuration of a flash memory 102 and the operation thereof as a semiconductor memory device in the second embodiment of the present invention.

Figure 7:
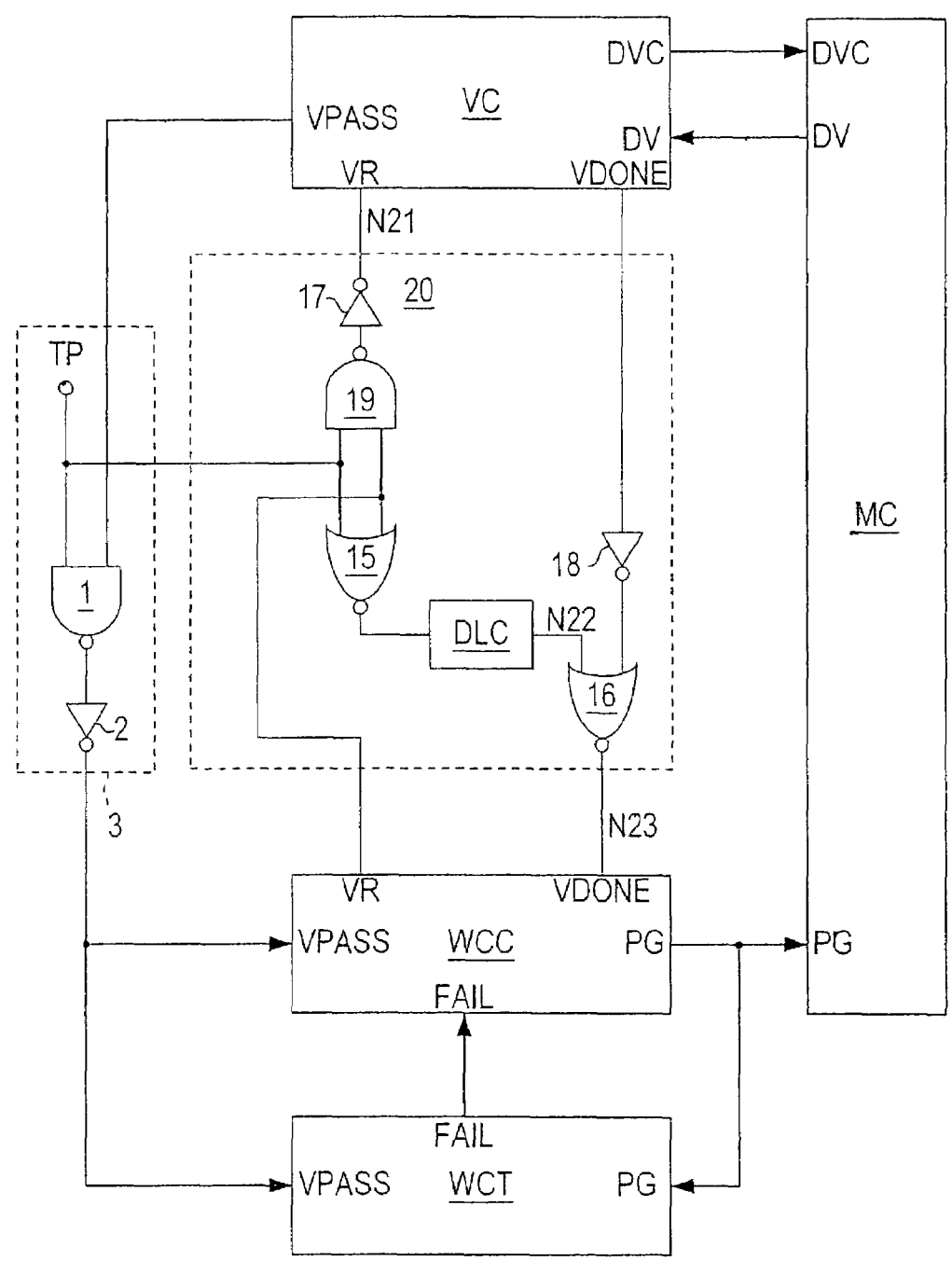
FIG. 7 is a circuit diagram showing the configuration of a flash memory in the second embodiment of the present invention.

The flash memory 102 is configured by a memory cell MC, a data write controlling circuit WCC, a data write counter circuit WCT, a verify circuit VC, a verify pass signal invalidating means 3 and a verify operation omitting means 20 as shown in FIG. 7. The verify operation omitting means 20 is added as the configuration of the flash memory 102, compared with the flash memory 100 described above.

The verify operation omitting means 20 is configured by NOR gates 15 and 16, NAND gate 19, inverters 17 and 18 and a delay circuit DLC.

One of the input terminals of the NOR gate 15 is connected to a verify start signal output terminal (VR) of the data write controlling circuit WCC. Also, the other input terminal of the NOR gate 15 is connected to a test pad TP in the verify pass signal invalidating means 3. The output terminal of the NOR gate 15 is connected to one of the input terminals of the NOR gate 16 via the delay circuit DLC. The delay circuit DLC transmits the signal output from the NOR gate 15, delayed in a specific period of time, to one of the input terminals of the NOR gate 16 via a node N22.

The other input terminal of the NOR gate 16 is connected to the output terminal of the inverter 18 while the output terminal of the NOR gate 16 to the verify done signal input terminal (VDONE) of the data write controlling circuit WCC via a node N23.

The input terminal of the inverter 18 is connected to the verify done signal output terminal (VDONE) of the verify circuit VC.

The other input terminal of the NAND gate 19 is connected to the test pad TP in the verify pass signal invalidating means 3. The output terminal of the NAND gate 19 is connected to the input terminal of the inverter 17. The output terminal of the inverter 17 is connected to the verify start signal input terminal (VR) of the verify circuit VC via a node N21.

Figure 8:
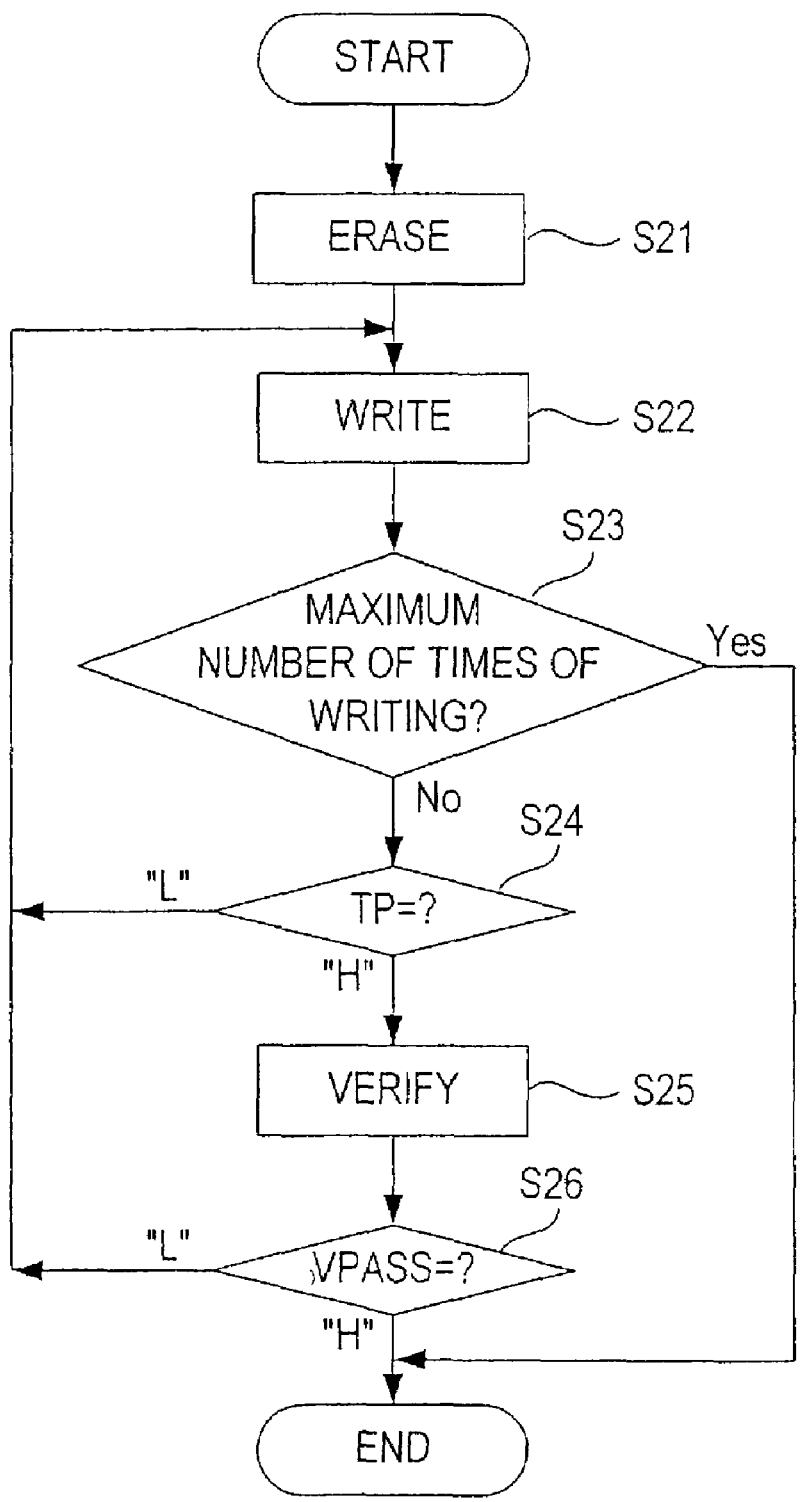
FIG. 8 is a flow chart showing the operation of the flash memory shown as FIG. 7.
Figure 9:
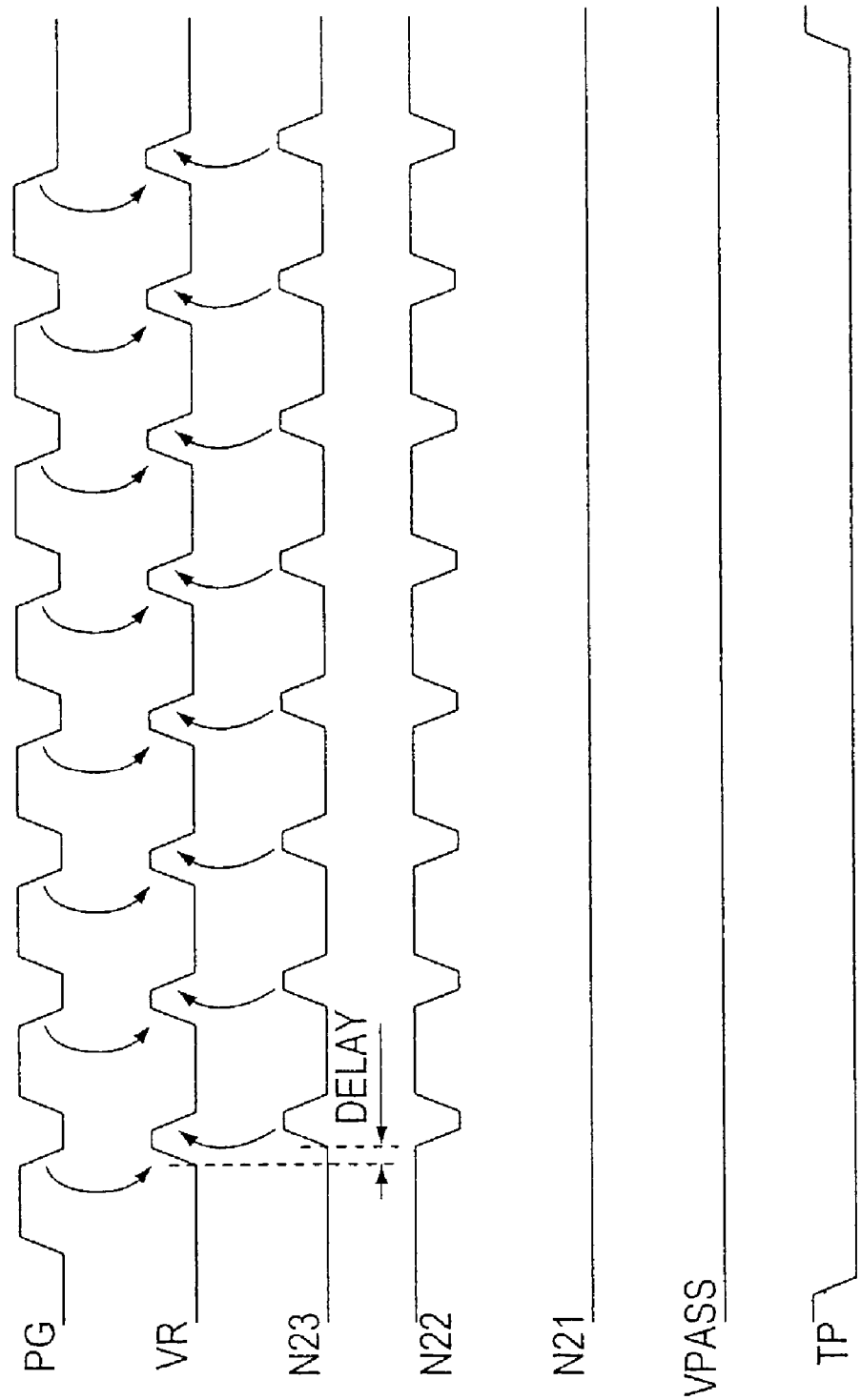
FIG. 9 is a timing chart showing the operation of the flash memory shown as FIG. 7.

The data program operation of the flash memory 102 as configured above will be explained in reference to the flow chart of FIG. 8 and the timing chart of FIG. 9.

First, the data program operation in this embodiment will be explained in reference to the flow chart of FIG. 8.

In starting the data program operation, the flash memory 102 executes a data erase operation first (step S21) and the write operation next (step S22).

After the write operation, the judgment is made whether the write operation is repeated maximum number of times or not preset in the data write counter circuit WCT (step S23).

When the write operation is repeated maximum number of times, the data program operation ends. On the other hand, when the write operation is not repeated maximum number of times, the logical level of the test pad TP is checked (step S24).

When the flash memory 102 is set at the test mode, in other words, when the test pad TP is fixed at L level, the next write operation starts without the verify operation being executed (step S22). Since then, only the write operation is repeated without the verify operation being executed until the number of repeating time reaches the maximum number of writing (loop of steps S22, S23 and 24).

When the test pad TP is fixed at H level, in other words, when the flash memory 102 is set at the normal mode, the verify operation is executed (step S25) and the logical level of the verify pass signal VPASS is checked (step S26).

When the verify pass signal VPASS is L level, in other words, when the result of the verify operation is "fail", the next write operation starts (step S22). When the verify pass signal VPASS is H level, in other words, when the verify operation has passed, the data program operation ends.

Next, the operations in the normal and test modes of the flash memory 102 will be explained in reference to the circuit diagram of FIG. 7 and the timing chart of FIG. 9.

(1) Normal Mode

The flash memory 102 is set at a normal mode by fixing the test pad TP at H level.

The data write controlling circuit WCC outputs an H level verify start signal VR after outputting an H level programming signal PG and executing the write operation to the memory cell MC. The verify start signal VR is input to one of the input terminals of the NAND gate 19 and to one of the input terminals of the NOR gate 15.

Since the test pad TP is fixed at H level in the normal mode, the other input terminal of the NAND gate 19 and the other input terminal of the NOR gate 15 are maintained active states.

Therefore, the inverter 17 transmits a signal synchronizing with the verify start signal VR output from the data write controlling circuit WCC and conforming to the logical level thereof to the verify start signal input terminal (VR) of the verify circuit VC via a node N21.

Also, the NOR gate 15 transmits an L level signal to the delay circuit DLC regardless of the verify start signal VR output from the data write controlling circuit WCC. For this reason, one of the input terminals of the NOR gate 16 connected to the node N22 is fixed at L level. Consequently, the NOR gate 16 transmits a signal synchronizing with the verify done signal VDONE output from the verify circuit VC and conforming to the logical level thereof to the verify done signal input terminal (VDONE) of the data write controlling circuit WCC via a node N23.

Since the verify pass signal input terminal (VPASS) of the data write controlling circuit WCC and the verify pass signal input terminal (VPASS) of the data write counter circuit WCT maintain L level when the result of verify operation is "fail", the write operation is repeated. On the other hand, since the verify circuit VC outputs the H level verify pass signal VPASS when the verify operation passes, the verify pass signal invalidating means 3 transmits an H level signal to the verify pass signal input terminal (VPASS) of the data write controlling circuit WCC and the verify pass signal input terminal (VPASS) of the data write counter circuit WCT. At this time, the data program operation ends.

As described above, the flash memory 102 in the normal mode repeats the data program operation and ends when the data program operation has passed.

(2) Test Mode

The flash memory 102 is set at a test mode by fixing the test pad TP at L level.

The data write controlling circuit WCC outputs an H level verify start signal VR after outputting an H level programming signal PG and executing the write operation to the memory cell MC. The verify start signal VR is input to one of the input terminals of the NAND gate 19 and to one of the input terminals of the NOR gate 15.

Since the test pad TP is fixed at L level in the test mode, the other input terminal of the NOR gate 15 is maintained inactive state. Therefore, a signal with a specific delay in the verify start signal VR output by itself via the node N23 is input to the verify done signal input terminal (VDONE) of the data write controlling circuit WCC. Then, as shown in the timing chart of FIG. 9, the data write controlling circuit WCC synchronizes with the rise edge of the signal input to the verify done signal input terminal (VDONE), and transits the verify start signal VR from H level (active) to L level (inactive).

Setting the delay time short by adjusting the time constant of the delay circuit DLC, the data write controlling circuit WCC receives the dummy signal of the verify done signal VDONE at the verify done signal output terminal (VDONE) as soon as outputting the H level verify start signal VR. In addition, the data write controlling circuit WCC has received the L level signal at the verify pass signal input terminal (VPASS) from the verify pass signal invalidating means 3. Therefore, the data write controlling circuit WCC outputs the programming signal PG soon after outputting the H level verify start signal VR for an extremely short time.

In addition, since the test pad TP is fixed at L level in the test mode, the other input terminal of the NAND gate 19 is also maintained inactive state. Therefore, the node N21 and the verify start signal input terminal (VR) of the verify circuit VC are held at L level. And further, only the write operation is repeated specific maximum number of times with the verify operation having never been executed in the flash memory 102 in the test mode.

According to the flash memory 102 and the data program operation thereof in the second embodiment, as described above, the write operation without the verify operation is repeated in short cycles from the beginning. As a result, the period of time needed for testing can be further saved, compared with that in the first embodiment.

Third Embodiment

There will be explained the configuration of a flash memory 103 and the operation thereof as a semiconductor memory device in the third embodiment of the present invention.

Figure 10:
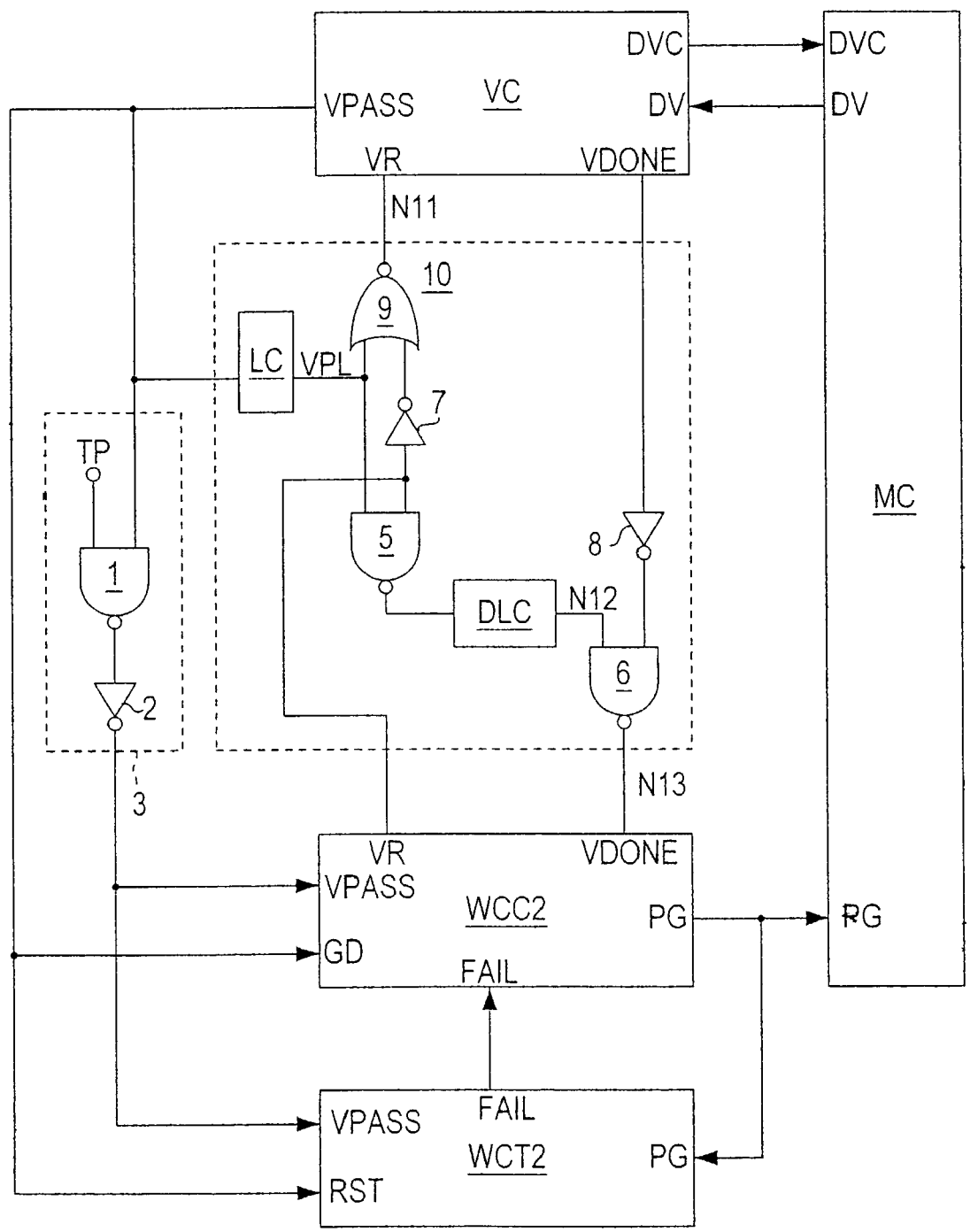
FIG. 10 is a circuit diagram showing the configuration of a flash memory in the third embodiment of the present invention.

The flash memory 103 is configured by a memory cell MC, a data write controlling circuit WCC2, a data write counter circuit WCT2, a verify circuit VC, a verify pass signal invalidating means 3 and a verify operation omitting means 10 as shown in FIG. 10. In the flash memory 103, the data write controlling circuit WCC is replaced by the data write controlling circuit WCC2, and the data write counter circuit WCT is replaced by the data write counter circuit WCT2, compared with the flash memory 101 in the first embodiment.

A gate-disturb (hereafter, referred to as GD) mode set terminal (GD) is added as the configuration of the data write controlling circuit WCC2, compared with the data write controlling circuit WCC. A reset terminal (RST) is added as the configuration of the data write counter circuit WCT2 compared with the data write counter circuit WCT. The GD mode set terminal in the data write controlling circuit WCC2 and the reset terminal (RST) in the data write counter circuit WCT2 are connected to the verify pass signal output terminal (VPASS) of the verify circuit VC in common.

The flash memory 103 as configured above has a "GD mode". In this mode, what is called "FF write operation", writing "1" in all the memory cells MC is executed.

Figure 11:
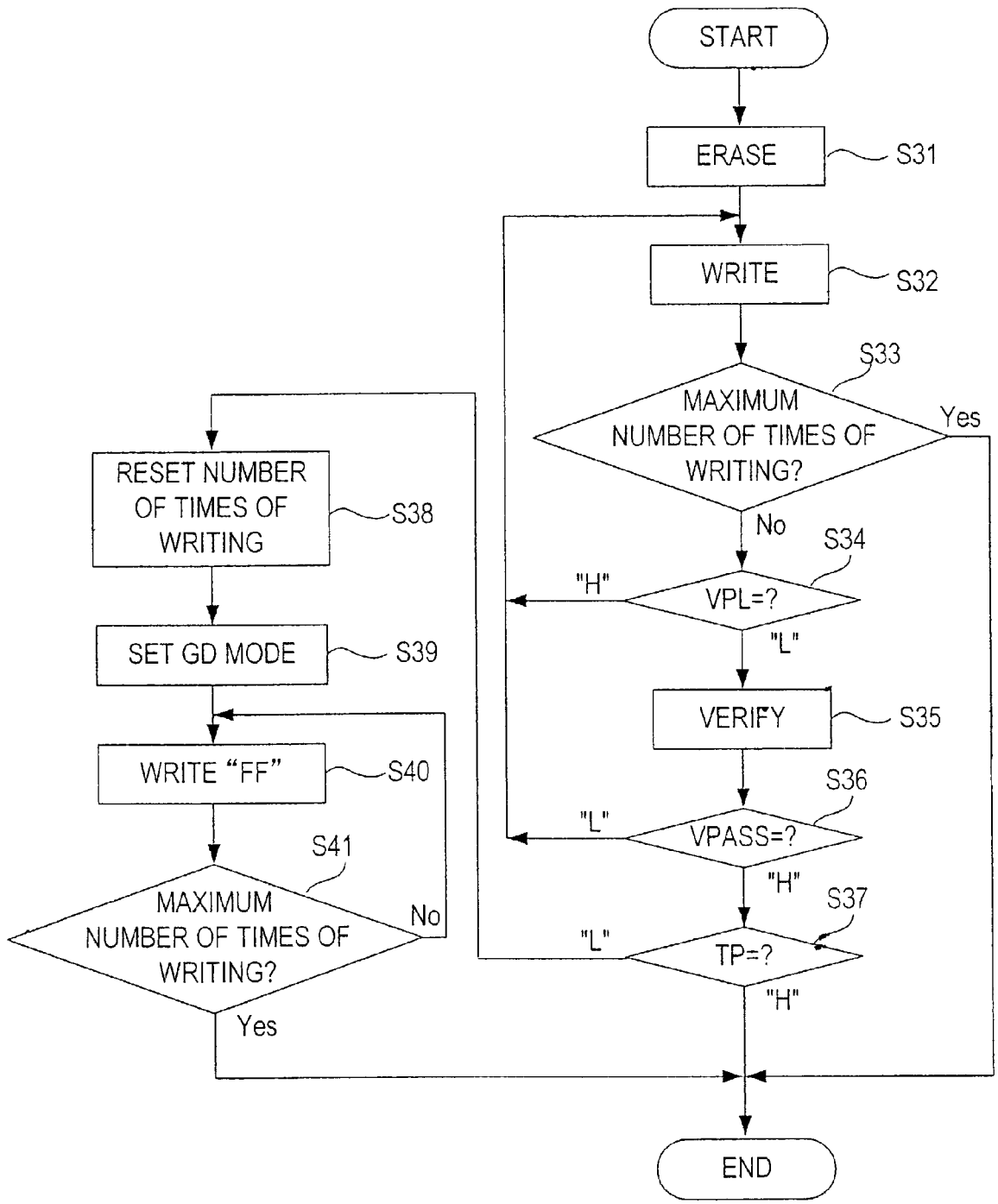
FIG. 11 is a flow chart showing the operation of the flash memory shown as FIG. 10.
Figure 12:
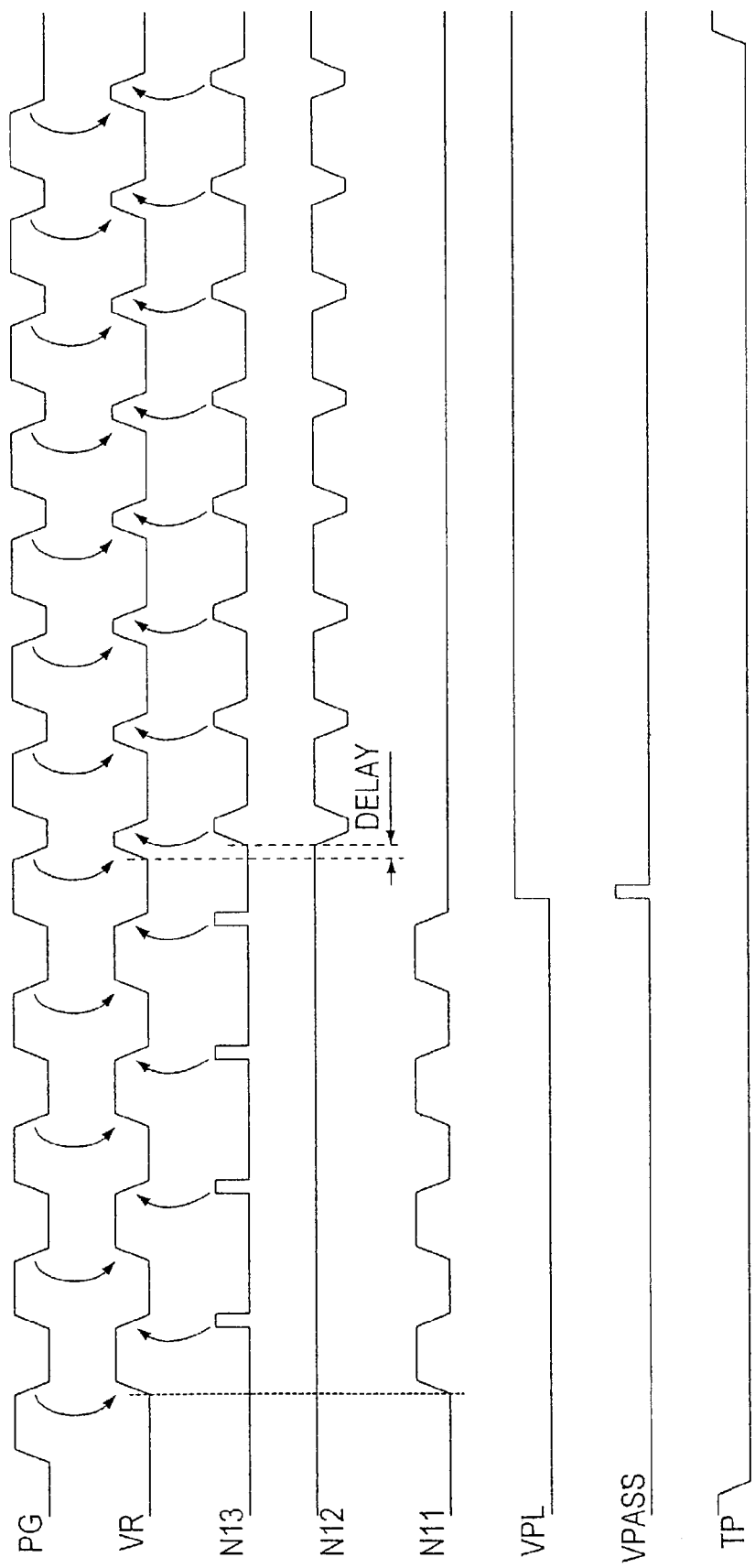
FIG. 12 is a timing chart showing the operation of the flash memory shown as FIG. 10.

Next, the data program operation of the flash memory 103 as configured above will be explained in reference to the flow chart of FIG. 11 and the timing chart of FIG. 12.

First, the data program operation in this embodiment will be explained in reference to the flow chart of FIG. 11.

Steps S31~S36 in the data program operation of the flash memory 103 are almost the same as steps S11~S16 in the data program operation of the flash memory 101 in the first embodiment.

In step S37, the logical level of a test pad TP is checked. When the test pad TP is fixed at H level, in other words, when the flash memory 103 is set at the normal mode, the data program operation ends. The difference between the data program operation of the flash memory 101 and the data program operation of the flash memory 103 is the operation after judging that the test pad TP is fixed at L level in step S37.

When the test pad TP is fixed at L level, the flash memory 103 turns to the test mode. Then the data write counter circuit WCT2 is reset by an H level verify pass signal VPASS output from the verify circuit VC (step S38). By being reset, the data write counter circuit WCT2 clears the number of write operation counted by then. Also, the data write controlling circuit WCC2 is set at the GD mode by the H level verify pass signal VPASS output from the verify circuit VC (step S39).

The data write controlling circuit WCC2 in the GD mode executes the FF write operation on all the memory cells MC (step S40). Hereby data "1" is written in each memory cell MC. This FF write operation is repeated maximum number of times (eight times, for example) preset in the data write counter circuit WCT2. It is to be noted that, since the data write counter circuit WCT2 is reset in step S38 although the write operation in step S32 is repeated several times before the data write controlling circuit WCC2 is set at the GD mode, the FF write operation in step S40 is repeated maximum number of times regardless of the number of write operation in step S32.

When the FF write operation is repeated maximum number of times preset in the data write counter circuit WCT2, the data program operation of the flash memory 103 ends.

Generally, if FF write operation ("1"-write operation) with an erase operation to each memory cell MC is repeated many times, the threshold voltage Vt excessively rises to make an excessive stress on an insulation film of a device. According to this embodiment, in this point, FF write operation ("1"-write operation) without an erase operation to all memory cells MC is repeated in steps S40 and S41. More specifically, the FF write operation is executed by applying a specific voltage only to a gate among source, drain and gate, of a transistor configuring each memory cell MC. By repeating the FF write operation, it becomes possible to reduce the stress on the device by lowering the threshold voltage Vt of the memory cell MC even if the threshold voltage Vt of the memory cell MC rises.

Next, the operations in the normal and test modes of the flash memory 103 will be explained in reference to the circuit diagram of FIG. 10 and the timing chart of FIG. 12.

(1) Normal Mode

The flash memory 103 is set at a normal mode by fixing the test pad TP at H level.

The flash memory 103 in the normal mode, as the flash memory 101 in the first embodiment, repeats the write operation until the verify operation passes.

(2) Test Mode

The flash memory 103 is set at a test mode by fixing the test pad TP at L level.

In the test mode, as in the normal mode, since the latched verify pass signal VPL output from the latch circuit LC is L level (initial value) until the verify operation passes, the other input terminal of the NAND gate 5 and the other input terminal of the NOR gate 9 are maintained inactive states. Therefore, a signal synchronizing with the verify start signal VR output from the data write controlling circuit WCC2 and conforming to the logical level thereof is input to the verify start signal input terminal (VR) of the verify circuit VC. On the other hand, a signal synchronizing with the verify done signal VDONE output from the verify circuit VC and conforming to the logical level thereof is input to the verify done signal input terminal (VDONE) of the data write controlling circuit WCC2.

When the result of verify operation is "fail", the flash memory 103 in the test mode operates as in the normal mode, in other words, the verify pass signal input terminal (VPASS) of the data write controlling circuit WCC2 and the verify pass signal input terminal (VPASS) of the data write counter circuit WCT2 maintain L level. Consequently, the write operation is repeated.

On the other hand, when the verify operation passes, the flash memory 103 in the test mode operates as follows.

Since the test pad TP is fixed at L level, the verify pass signal input terminal (VPASS) of the data write controlling circuit WCC2 and the verify pass signal input terminal (VPASS) of the data write counter circuit WCT2 are fixed at L level by the verify pass signal invalidating means 3 even if the verify circuit VC outputs the H level verify pass signal VPASS. Also, the data write counter circuit WCT2 is reset by synchronizing with the rise edge of the verify pass signal VPASS, and the data write controlling circuit WCC2 is set at the GD mode.

When the verify circuit VC outputs an H level verify pass signal VPASS, the latch circuit LC holds the latched verify pass signal VPL at H level. For this reason, the other input terminal of the NAND gate 5 and the other input terminal of the NOR gate 9 are maintained active states. Therefore, when the data write controlling circuit WCC2 outputs the H level verify start signal VR, a signal with a specific delay in the verify start signal VR is input to a node N13 and the verify done signal input terminal (VDONE) of the data write controlling circuit WCC2 through the operations of NAND gate 5, delay circuit DLC and NAND gate 6. Also, the verify start signal input terminal (VR) of the verify circuit VC connected to the node N11 is fixed at L level. As a result, the write operation without the verify operation is quickly repeated.

In the test mode, however, the flash memory 103 is automatically set at the GD mode. Consequently, the FF write operation on each the memory cell MC is repeated maximum number of times (eight times, for example) preset in the data write counter circuit WCT2. It is to be noted that, since the verify start signal input terminal (VR) of the verify circuit VC is fixed at L level when the flash memory 103 is set at the GD mode, the FF write operation is repeated without the verify operation being executed. When the FF write operation is repeated maximum number of times, the data program operation ends.

According to the flash memory 103 and the data program operation thereof in the third embodiment, as described above, the same effect can be obtained as that in the flash memory 101 and the data program operation thereof in the first embodiment.

Further according to the flash memory 103 and the data program operation thereof in the third embodiment, the GD mode is provided. In this GD mode, "1"-write operation with an erase operation is repeated. Therefore, there can be expected that the threshold voltage Vt of the memory cell MC having a fear of rising excessively is restrained from rising.

Although the preferred embodiment of the present invention has been described referring to the accompanying drawings, the present invention is not restricted to such examples. It is evident to those skilled in the art that the present invention may be modified or changed within a technical philosophy thereof and it is understood that naturally these belong to the technical philosophy of the present invention.

For example, although the preferred embodiment of the present invention has been described by using a flash memory as a semiconductor memory device, the present invention can be adopted to another semiconductor memory device such as an EEPROM.

Further, the data write controlling circuit WCC2 and the data write counter circuit WCT2 in the flash memory 103 in the third embodiment can be adopted to the flash memory 102 in the second embodiment. In this case, the FF write operation is executed on each memory cell MC from the beginning when the test mode is set.

What is claimed is:

1. A semiconductor memory device comprising:
    a memory cell that stores data;
    a verify circuit that verifies data stored in the memory cell responsive to a verify start signal and that outputs a verify pass signal when a desired result is obtained;
    a data write controlling circuit that repeats a data write operation to the memory cell until the verify pass signal is input thereto, and that generates and outputs the verify start signal after each data write operation;
    a verify pass signal invalidating circuit that invalidates the verify pass signal when a test mode is set; and
    a verify operation omitting circuit, coupled to receive the verify start signal as output by the data write controlling circuit, that provides the verify start signal output from the data write controlling circuit to the verify circuit responsive to the verify pass signal output by the verify circuit, wherein the verify operation omitting circuit stops providing the verify start signal as output to the verify circuit for the remainder of the test mode once the verify pass signal indicates that the desired result is obtained, so that the data write operation is repeated for the remainder of the test mode without verification by the verify circuit,
    wherein once activated, the verify operation omitting circuit outputs a signal to stop an output of the verify start signal to the data write controlling circuit upon receiving the verify start signal from the data write controlling circuit,
    wherein the verify circuit outputs a verify end signal upon completing a verify operation and the data write controlling circuit includes a verify done terminal for receiving the verify end signal, and
    wherein the verify operation omitting circuit, when activated and upon receiving the verify start signal from the data write controlling circuit, outputs a dummy verify end signal to the verify done terminal of the data write controlling circuit as the signal to stop an output of the verify start signal.

2. A semiconductor memory device according to claim 1, wherein a data write operation to a memory cell after the verify operation omitting circuit becomes active is executed by applying a voltage only to a gate from among a source, a drain and a gate of a transistor configuring the memory cell.

3. A semiconductor memory device according to claim 1, wherein the semiconductor memory device is a flash memory.

4. A semiconductor memory device according to claim 1, wherein the semiconductor memory device is an EEPROM.

5. A semiconductor memory device comprising:
    a memory cell that stores data;
    a verify circuit that verifies data stored in the memory cell responsive to a verify start signal and that outputs a verify pass signal when a desired result is obtained;
    a data write controlling circuit that repeats a data write operation to the memory cell until the verify pass signal is input thereto, and that generates and outputs the verify start signal after each data write operation;
    a verify pass signal invalidating circuit that invalidates the verify pass signal when a test mode is set; and
    a verify operation omitting circuit, coupled to receive the verify start signal as output by the data write controlling circuit, that provides the verify start signal output from the data write controlling circuit to the verify circuit, and that becomes active when the test mode is set so that the verify start signal is not provided to the verify circuit for the entirety of the test mode and so that the data write operation is repeated without verification by the verify circuit when the verify start signal is not provided,
    wherein once activated, the verify operation omitting circuit outputs a signal to stop an output of the verify start signal to the data write controlling circuit upon receiving the verify start signal from the data write controlling circuit,
    wherein the verify circuit outputs a verify end signal upon completing a verify operation and the data write controlling circuit includes a verify done terminal for receiving the verify end signal, and
    wherein the verify operation omitting circuit, when activated and upon receiving the verify start signal from the data write controlling circuit, outputs a dummy verify end signal to the verify done terminal of the data write controlling circuit as the signal to stop an output of the verify start signal.

6. A semiconductor memory device according to claim 5, wherein a data write operation to a memory cell after the verify operation omitting circuit becomes active is executed by applying a voltage only to a gate from among a source, a drain and a gate of a transistor configuring the memory cell.

7. A semiconductor memory device according to claim 5, wherein the semiconductor memory device is a flash memory.

8. A semiconductor memory device according to claim 5, wherein the semiconductor memory device is an EEPROM.

* * * * *